(12) United States Patent
Bhattacharya et al.

(10) Patent No.: US 7,260,767 B2
(45) Date of Patent: Aug. 21, 2007

(54) METHODS AND APPARATUS FOR ERROR CORRECTION OF TRANSPARENT GFP (GENERIC FRAMING PROCEDURE) SUPERBLOCKS

(75) Inventors: Santanu Bhattacharya, Delhi (IN); Neeraj Gupta, New Delhi (IN); Yogesh Mittal, Uttar Pradesh (IN); Priya Darshini, Delhi (IN); Arunava Dutta, Calcutta (IN); Suvhasis Mukhopadhyay, Shrewsbury, MA (US)

(73) Assignee: Transwitch Corporation, Shelton, CT (US)

( * ) Notice: Subject to any disclaimer, the term of this patent is extended or adjusted under 35 U.S.C. 154(b) by 228 days.

(21) Appl. No.: 10/924,038

(22) Filed: Aug. 23, 2004

(65) Prior Publication Data

US 2006/0041826 A1 Feb. 23, 2006

(51) Int. Cl.
H03M 13/15 (2006.01)
(52) U.S. Cl. ............ 714/782; 370/412; 370/235; 370/470
(58) Field of Classification Search ......... 458/450, 458/412, 410, 414, 433, 490, 26.1, 432.1; 320/412, 235, 420; 214/281, 282; 455/450
See application file for complete search history.

(56) References Cited

U.S. PATENT DOCUMENTS

| | | | | |
|---|---|---|---|---|
| 6,038,694 A | * | 3/2000 | Swallow | 714/781 |
| 6,091,949 A | * | 7/2000 | Sanchez | 455/417 |
| 6,859,437 B2 | * | 2/2005 | Miller et al. | 370/235 |
| 6,993,046 B1 | * | 1/2006 | Hernandez-Valencia et al. | 370/470 |
| 2005/0013313 A1 | * | 1/2005 | Liao et al. | 370/412 |
| 2005/0118999 A1 | * | 6/2005 | Zhu | 455/432.1 |
| 2005/0157648 A1 | * | 7/2005 | Miller et al. | 370/235 |

OTHER PUBLICATIONS

"Master Transparent-Mode GFP: Part1"; by Steve Gorshe; Storage Area Networking; 2002.
"ITU-T Series G: Transmission Systems and Media, Digital Systems and Networks; Generic Framing Procedure (GFP)"; International Telecommunication Union; Dec. 2003.
"An Efficient Scheme for SuperBlock Processing of GFP Transparent Mapping"; article; 2003.
"SONET and SDH: Advanced Topics"; InformIT; Oct. 31, 2003; by Greg Bernstein, Bala Rajagopalan, Debanjan Saha; internet article; www.informit.com.

* cited by examiner

*Primary Examiner*—Joseph Feild
*Assistant Examiner*—David Q. Nguyen
(74) *Attorney, Agent, or Firm*—Gordon & Jacobson, PC

(57) ABSTRACT

Methods for correcting errors in a GFP-T superblock include buffering the 64 bytes of data in an 8×8 byte buffer, buffering the flag byte in a separate buffer, calculating the CRC remainder, and performing single and double bit error correction in three stages. In the first stage, the CRC remainder is compared to a single bit error syndrome table and if an error is located, it is corrected. In the second stage, the CRC remainder is compared to a double bit error syndrome table and if an error is located, it is corrected. The third stage corrects the second error of a double bit error. The flag byte is processed first, followed by the data bytes, eight bytes at a time.

8 Claims, 9 Drawing Sheets

FIGURE 1: The GFP core header consists of a two-octet-length field and a CRC-16 error check code over this field.

FIGURE 2: With GFP-T, the client 8B/10B codes are decoded into control codes and 8-bit data values. Eight of these decoded characters are then mapped into the eight payload bytes of a 64B/65B code.

FIGURE 3: The superblock structure concatenates the payload bytes in order, then takes the leading flag bits of the eight constituent 64B/65B codes and groups them into a trailing byte.

where: Octet $j, k$ is the $k^{th}$ octet of the $j^{th}$ 64B/65B code in the superblock. $L_j$ is the leading (Flag) bit $j^{th}$ 64B/65B code in the superblock. $C_i$ is the $i^{th}$ error control bit Double Bit Error, First Error Correction Logic

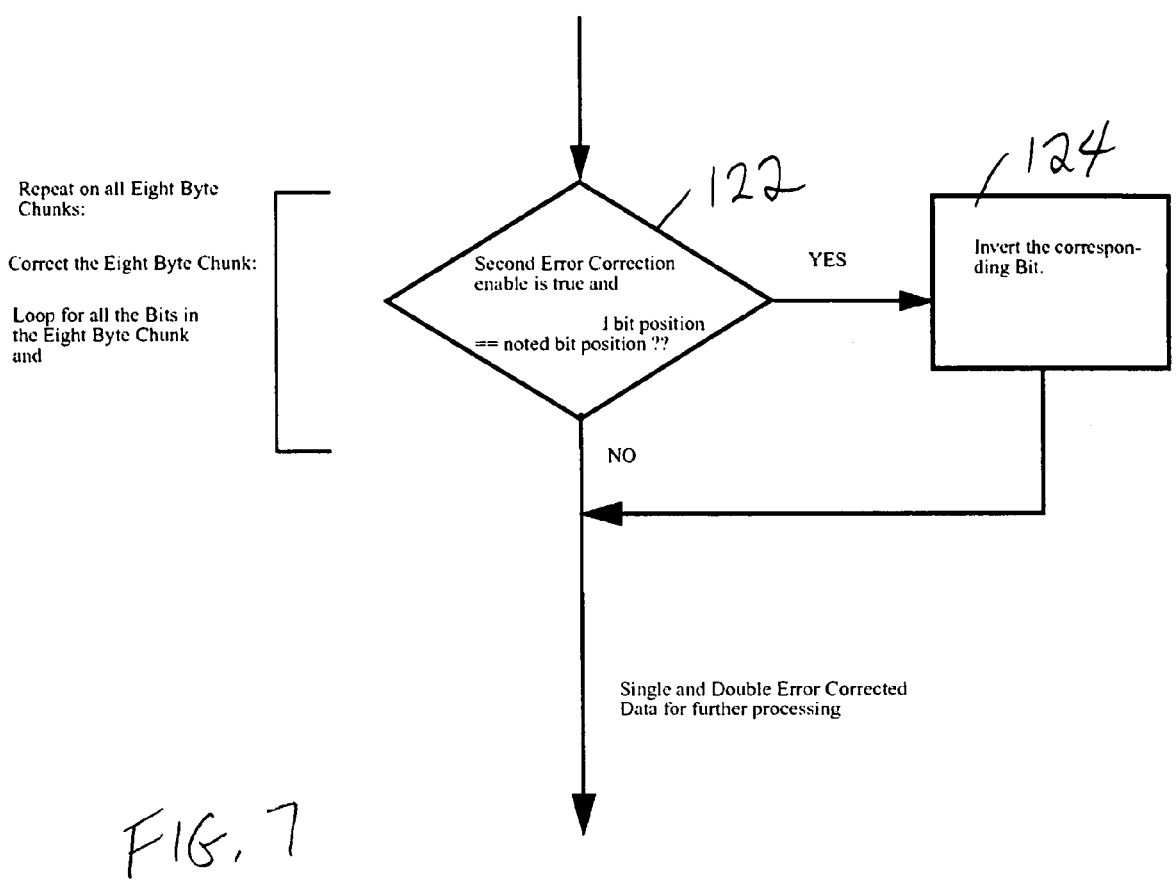
Figure C: Double Bit Error, Second Error Correction Logic

```
AE68 5734 2B9A 15CD C0E9 AA7B 9F32 4F99
EDC3 BCEE 5E77 E534 729A 394D D6A9 A15B
9AA2 4D51 ECA7 BC5C 5E2E 2F17 DD84 6EC2
3761 D1BF A2D0 5168 28B4 145A 0A2D CF19
AD83 9CCE 4E67 ED3C 769E 3B4F D7A8 6BD4
35EA 1AF5 C775 A9B5 9ED5 8565 88BD 8E51
8D27 8C9C 464E 2327 DB9C 6DCE 36E7 D17C
68BE 345F D020 6810 3408 1A04 0D02 0681

C94F AEA8 5754 2BAA 15D5 C0E5 AA7D 9F31
8597 88C4 4462 2231 DB17 A784 53C2 29E1
DEFF A570 52B8 295C 14AE 0A57 CF24 6792
33C9 D3EB A3FA 51FD E2F1 BB77 97B4 4BDA
25ED D8F9 A673 9936 4C9B EC42 7621 F11F
B280 5940 2CA0 1650 0B28 0594 02CA 0165
CABD AF51 9DA7 84DC 426E 2137 DA94 6D4A
36A5 D15D A2A1 9B5F 87A0 43D0 21E8 10F4

087A 043D C811 AE07 9D0C 4E86 2743 D9AE
6CD7 FC64 7E32 3F19 D583 A0CE 5067 E23C
711E 388F D648 6B24 3592 1AC9 C76B A9BA
54DD E061 BA3F 9710 4B88 25C4 12E2 0971
CEB7 AD54 56AA 2B55 DFA5 A5DD 98E1 867F
8930 4498 224C 1126 0893 CE46 6723 F99E
7CCF F468 7A34 3D1A 1E8D C549 A8AB 9E5A
4F2D ED99 BCC3 946E 4A37 EF14 778A 3BC5

D7ED A1F9 9AF3 8776 43BB EBD2 75E9 F0FB
B272 5939 E693 B946 5CA3 E45E 722F F318
798C 3CC6 1E63 C53E 629F FB40 7DA0 3ED0
1F68 0FB4 07DA 03ED CBF9 AFF3 9DF6 4EFB
ED72 76B9 F153 B2A6 5953 E6A6 7353 F3A6
79D3 F6E6 7B73 F7B6 7BDB F7E2 7BF1 F7F7
B1F4 58FA 2C7D DC31 A417 9804 4C02 2601
D90F A688 5344 29A2 14D1 C067 AA3C 551E

2A8F DF48 6FA4 37D2 1BE9 C7FB A9F2 54F9
E073 BA36 5D1B E482 7241 F32F B398 59CC
2CE6 1673 C136 609B FA42 7D21 F49F B040
5820 2C10 1608 0B04 0582 02C1 CB6F AFB8
57DC 2BEE 15F7 C0F4 607A 303D D211 A307
9B8C 4DC6 26E3 D97E 6CBF FC50 7E28 3F14
1F8A 0FC5 CDED ACF9 9C73 8436 421B EB02
7581 F0CF B268 5934 2C9A 164D C129 AA9B

9F42 4FA1 EDDF BCE0 5E70 2F38 179C 0BCE
05E7 C8FC 647E 323F D310 6988 34C4 1A62
0D31 CC97 AC44 5622 2B11 DF87 A5CC 52E6
2973 DEB6 6F5B FDA2 7ED1 F567 B0BC 585E
2C2F DC18 6E0C 3706 1B83 C7CE 63E7 FBFC
7DFE 3EFF D570 6AB8 355C 1AAE 0D57 CCA4
6652 3329 D39B A3C2 51E1 E2FF BB70 5DB8
2EDC 176E 0BB7 CFD4 67EA 33F5 D3F5 A3F5

9BF5 87F5 89F5 8EF5 8D75 8CB5 8C55 8C25
8C1D 8C01 8C0F 8C08 4604 2302 1181 C2CF
AB68 55B4 2ADA 156D C0B9 AA53 9F26 4F93
EDC6 76E3 F17E 78BF F650 7B28 3D94 1ECA
0F65 CDBD ACD1 9C67 843C 421E 210F DA88
6D44 36A2 1B51 C7A7 A9DC 54EE 2A77 DF34
6F9A 37CD D1E9 A2FB 9B72 4DB9 ECD3 BC66
5E33 E516 728B F34A 79A5 F6DD B161 92BF 8350 41A8 20D4 106A 0835 CE15 AD05 9C8D
8449 882B 8E1A 470D E989 BECB 956A 4AB5
EF55 BDA5 94DD 8061 8A3F 8F10 4788 23C4
11E2 08F1 CE77 AD34 569A 2B4D DFA9 A5DB
98E2 4C71 EC37 BC14 5E0A 2F05 DD8D A4C9
986B 863A 431D EB81 BFCF 95E8 4AF4 257A
12BD C351 ABA7 9FDC 4FEE 27F7 D9F4 6CFA
367D D131 A297 9B44 4DA2 26D1 D967 A6BC 535E 29AF DED8 6F6C 37B6 1BDB C7E2 63F1
```

FIG. 8

```
07DD C9E1 AEFF 9D70 4EB8 275C 13AE 09D7
CEE4 6772 33B9 D3D3 A3E6 51F3 E2F6 717B
F2B2 7959 F6A3 B15E 58AF E658 732C 3996
1CCB C46A 6235 FB15 B785 91CD 82E9 8B7B
8FB2 47D9 E9E3 BEFE 5F7F E5B0 72D8 396C
1CB6 0E5B CD22 6691 F947 B6AC 5B56 2DAB
DCDA 6E6D FD39 B493 9046 4823 EE1E 770F
F188 78C4 3C62 1E31 C517 A884 5442 2A21

DF1F A580 52C0 2960 14B0 0A58 052C 0296
014B CAAA 6555 F8A5 B65D 9121 829F 8B40
45A0 22D0 1168 08B4 045A 022D CB19 AF83
9DCE 4EE7 ED7C 76BE 3B5F D7A0 6BD0 35E8
1AF4 0D7A 06BD C951 AEA7 9D5C 4EAE 2757
D9A4 6CD2 3669 D13B A292 5149 E2AB BB5A
5DAD E4D9 B863 963E 4B1F EF80 77C0 3BE0
1DF0 0EF8 077C 03BE 01DF CAE0 6570 32B8

195C 0CAE 0657 C924 6492 3249 D32B A39A
51CD E2E9 BB7B 97B2 4BD9 EFE3 BDFE 5EFF
E570 72B8 395C 1CAE 0E57 CD24 6692 3349
D3AB A3DA 51ED E2F9 BB73 97B6 4BDB EFE2
77F1 F1F7 B2F4 597A 2CBD DC51 A427 981C
4C0E 2607 D90C 6C86 3643 D12E 6897 FE44
7F22 3F91 D5C7 A0EC 5076 283B DE12 6F09
FD8B B4CA 5A65 E73D B991 96C7 816C 40B6

205B DA22 6D11 FC87 B44C 5A26 2D13 DC86
6E43 FD2E 7E97 F544 7AA2 3D51 D4A7 A05C
502E 2817 DE04 6F02 3781 D1CF A2E8 5174
28BA 145D C021 AA1F 9F00 4F80 27C0 13E0
09F0 04F8 027C 013E 009F CA40 6520 3290
1948 0CA4 0652 0329 CB9B AFC2 57E1 E1FF
BAF0 5D78 2EBC 175E 0BAF CFD8 67EC 33F6
19FB C6F2 6379 FBB3 B7D6 5BEB E7FA 73FD

F3F1 B3F7 93F4 49FA 24FD D871 A637 9914
4C8A 2645 D92D A699 9943 86AE 4357 EBA4
75D2 3AE9 D77B A1B2 50D9 E263 BB3E 5D9F
E4C0 7260 3930 1C98 0E4C 0726 0393 CBC6
65E3 F8FE 7C7F F430 7A18 3D0C 1E86 0F43
CDAE 66D7 F964 7CB2 3E59 D523 A09E 504F
E228 7114 388A 1C45 C42D A819 9E03 850E
4287 EB4C 75A6 3AD3 D766 6BB3 FFD6 7FEB

F5FA 7AFD F771 B1B7 92D4 496A 24B5 D855
A625 991D 8681 894F 8EA8 4754 23AA 11D5
C2E5 AB7D 9FB1 85D7 88E4 4472 2239 DB13
A786 53C3 E3EE 71F7 F2F4 797A 3CBD D451
A027 9A1C 4D0E 2687 D94C 6CA6 3653 D126
6893 FE46 7F23 F59E 7ACF F768 7BB4 3DDA
1EED C579 A8B3 9E56 4F2B ED9A 76CD F169
B2BB 9352 49A9 EEDB BD62 5EB1 E557 B8A4

5C52 2E29 DD1B A482 5241 E32F BB98 5DCC
2EE6 1773 C1B6 60DB FA62 7D31 F497 B044
5822 2C11 DC07 A40C 5206 2903 DE8E 6F47
FDAC 7ED6 3F6B D5BA 6ADD FF61 B5BF 90D0
4868 2434 121A 090D CE89 AD4B 9CAA 4E55
ED25 BC9D 9441 802F 8A18 450C 2286 1143
C2AE 6157 FAA4 7D52 3EA9 D55B A0A2 5051
E227 BB1C 5D8E 2EC7 DD6C 6EB6 375B D1A2

68D1 FE67 B53C 5A9E 2D4F DCA8 6E54 372A
1B95 C7C5 A9ED 9EF9 8573 88B6 445B E822
7411 F007 B20C 5906 2C83 DC4E 6E27 FD1C
7E8E 3F47 D5AC 6AD6 356B 1111 1111 1111
1111 1111 1111 1111 1111 1111 1111 1111
1111 1111 1111 1111 1111 1111 1111 1111
1111 1111 1111 1111 1111 1111 1111 1111
1111 1111 1111 1111 1111 1111 1111 1111

METHODS AND APPARATUS FOR ERROR CORRECTION OF TRANSPARENT GFP (GENERIC FRAMING PROCEDURE) SUPERBLOCKS

BACKGROUND OF THE INVENTION

1. Field of the Invention

This invention relates broadly to telecommunications. More particularly, this invention relates to highly efficient error correction of GFP superblocks.

2. State of the Art

The Synchronous Optical Network (SONET) or the Synchronous Digital Hierarchy (SDH), as it is known in Europe, is a common telecommunications transport scheme. SONET was designed in the early 1980s to accommodate a plurality of time division multiplexed continuous signals such as T-1 or E-1 signals. T-1/E-1 signals were designed in the 1960s to carry a plurality of digitized audio (telephone) signals from one telephone company office (switch) to another.

Developed in the early 1970's, ETHERNET was designed primarily to allow multiple personal computers to share a single laser printer. Although ETHERNET has gone through many changes since the first version was used in 1973, it is still fundamentally not synchronous. Unlike SONET/SDH which was developed to carry many continuous streams of data multiplexed in a regularly occurring frame of fixed length, ETHERNET was designed to carry discontinuous data streams in randomly occurring packets of widely varying length. A word used to describe this nature of ETHERNET is "bursty". In addition to ETHERNET, some other networking protocols have been developed for storage area networks (SANs). These other protocols include Fiber Channel, ESCON (enterprise system connection), and FICON (fiber connection). They are similar to ETHERNET in that they are bursty.

For many years, it has been recognized that it would be desirable to transmit ETHERNET packets over long distances using a SONET/SDH network. However, because of the fundamental differences between synchronous frames and asynchronous packets, some mechanism was needed to encapsulate the ETHERNET data within a SONET/SDH frame. The challenge in doing this is to fill the SONET frame with as much ETHERNET data as possible so that bandwidth is not wasted while at the same time providing minimal latency (time data waits in a buffer before being transmitted). One of the latest methods for accomplishing this task is called the Generic Framing Procedure (GFP). GFP is "generic" because it is designed to transport any signal including ETHERNET, Fiber Channel, ESCON, FICON, and others over fixed data rate optical channels in a SONET/SDH network or OTN (optical transport network).

GFP is used in conjunction with other SONET/SDH specifications such as Virtual Concatenated Groups (VCGs) and Link Capacity Adjustment Scheme (LCAS) to map variable length packets into "containers" (also known as "tributaries") of a SONET/SDH frame.

There are currently two modes of mapping data into a GFP frame: frame mapped GFP (GFP-F) and transparent mapped GFP (GFP-T). GFP-F is used for ETHERNET (some versions but not all) and other protocols where the entire client frame is mapped into a single GFP frame. GFP-T facilitates the transport of block coded signals such as those of Fiber Channel, ESCON, FICON, and Gigabit ETHERNET, which also require very low transmission latency.

Prior art FIG. 1 illustrates the fields of a GFP frame. The two basic parts of the frame are the core header (4 bytes) and the payload area (variable length up to 65535 bytes). The core header includes a payload length indicator (PLI, 2 bytes) and the core header error correction (cHEC) code (2 bytes). The payload area includes the payload header (4 to 64 bytes), the payload information field (up to 65531 bytes), and an optional payload FCS (4 bytes). The payload header includes the type (4 bytes) and an extension header identifier (0 to 60 bytes).

The present invention is concerned with GFP-T. As mentioned above GFP-T facilitates the transport of block coded signals which also require very low transmission latency. These signals are encoded by clients with an 8B/10B block code. This code is used to communicate data and control information. More particularly, the 8-bit data values are mapped (encoded) into a 10-bit "transmission character". The code assignment is arranged so that the number of 1s and 0s transmitted on the line remains balanced. This increases the number of line transitions, thereby facilitating PLL synchronization. It also maintains DC balance over time. In addition, twelve of the 10-bit codes are reserved for use as control codes so that the data source may signal the data sink.

In order to transport 8B/10B encoded signals over the SONET/SDH network, GFP-T decodes the 8B/10B characters into 8-bit data characters and control codes. Eight of the decoded characters are mapped into the eight payload bytes of a 64B/65B code. This is shown by example in prior art FIG. 2. The (leading) flag bits of the 64B/65B code (shown as octet L in FIG. 2) indicate whether the 64B/65B block includes any control codes, i.e. a flag=1 indicates that the octet in the corresponding position of the next eight octets is a control code. In a GFP-T frame, after the 4 byte payload header, the payload area is filled with a plurality of "superblocks". Each superblock includes eight 64B/65B blocks and one 16-bit CRC, i.e. 67 bytes. The last octet of the superblock before the CRC includes eight flag bits. This is often referred to as the "superblock control byte". Prior art FIG. 3 illustrates the mapping of the superblock.

In order to address the physical properties of the transport medium and to aid in maintaining synchronization, GFP frames are scrambled by a self-synchronous scrambler. The scrambler uses a polynomial of $x^{43}+1$. The scrambler takes each bit of the payload area (including the superblock CRC) and exclusively ORs it with the scrambler output bit that precedes it by 43 bit positions. The scrambler state is retained between successive GFP frames, making it more difficult for a user to purposely choose a malicious payload pattern (e.g. one which would cause loss of synchronization). The superblock CRC is calculated prior to scrambling and is checked at the decoder after descrambling. An unfortunate drawback of this scrambling technique is that each transmission error produces a pair of errors (43 bits apart) in the descrambled data stream. The CRC, therefore, must be able to correct these two errors. The recommended CRC generator polynomial generates a superblock CRC which can detect three bit errors, correct single bit errors, and correct double bit errors spaced 43 bits apart. To accomplish this, the syndromes for single bit errors and double bit errors spaced 43 bits apart are all unique.

When demapping a GFP-T signal, the superblock control byte must be "realigned" (the flag bits moved back to their original leading bit locations) before the 64B/65B code can be mapped back into 8B/10B code. Before this is done, the superblock CRC is used to detect and possibly correct bit errors in the superblock. The recommended demapping procedure is detailed in ITU specification G.7041, the complete disclosure of which is hereby incorporated herein by reference.

The following description is taken from the G.7041 specification. The 16 error control bits in a superblock contain a CRC-16 error check code over the 536 bits in that superblock. If the demapper detects an error, it should output either 10B error characters or unrecognized 10B characters in place of all of the client characters contained in that superblock. This replacement guarantees that the client receiver will be able to detect the presence of the error. The generator polynomial for the CRC-16 is $G(x)=x^{16}+x^{15}+x^{12}+x^{10}+x^4+x^3+x^2+x+x^0$ with an initialization value of zero, where $x^{16}$ corresponds to the MSB and $x^0$ to the LSB. The superblock CRC is generated by the source adaptation process using the following steps:

1. The first 65 octets of the superblock are taken in network octet order, most significant bit first, to form a 520-bit pattern representing the coefficients of a polynomial $M(x)$ of degree 519.

2. $M(x)$ is multiplied by $x^{16}$ and divided (modulo 2) by $G(x)$, producing a remainder $R(x)$ of degree 15 or less.

3. The coefficients of $R(x)$ are considered to be a 16-bit sequence, where $x^{15}$ is the most significant bit.

4. This 16-bit sequence is the CRC-16.

Single error correction is also possible with this CRC-16. However, since the sink adaptation process performs the CRC-16 check after the payload descrambling is performed, the error correction circuit should account for single bit errors as well as double errors spaced 43 bits apart coming out of the descrambler.

The sink adaptation process performs steps 1-3 in the same manner as the source adaptation process. In the absence of bit errors, the remainder shall be 0000 0000 0000 0000.

Though not stated in the G.7041 specification, when the remainder is not zero it is referred to as a "syndrome". Syndromes can be used to detect the location of a bit error in conjunction with a syndrome table which has a 1:1 correspondence with each bit in the payload.

The G.7041 recommendation has several disadvantages. Processing an entire superblock according to the recommendation requires a 536-bit datapath and a relatively large amount of storage space which complicates implementation on a chip. It is also difficult to support high speed applications when processing all sixty-seven bytes at one time. The physical size of the logic introduces latency.

Although parts of the G.7041 recommendation can be ignored while still maintaining interoperability, there are several issues which cannot be ignored. These issues include the following: the flag byte (which is the last byte before the FCS bytes in the superblock) must be corrected before processing any of the other bytes in the superblock; double bit error correction requires that errors be correctable for bits which are 43 bits apart; and there needs to be an indication of whether a detected error has been corrected.

SUMMARY OF THE INVENTION

It is therefore an object of the invention to provide methods and apparatus for egress side GFP-T superblock error detection and correction.

It is another object of the invention to provide said methods and apparatus using a reduced datapath.

It is a further object of the invention to provide said methods and apparatus with the flag byte being processed before the other bytes.

It is also an object of the invention to provide said methods and apparatus detecting and correcting double bit errors as well as single bit errors.

It is an additional object of the invention to provide said methods and apparatus indicating whether detected errors have been corrected.

In accord with these objects, which will be discussed in detail below, the methods of the invention include buffering the 64 bytes of data from a superblock in an 8×8 byte buffer, buffering the flag byte in a separate buffer, calculating the CRC remainder, and performing single and double bit error correction in three stages. In the first stage, the flag byte and the 64 data bytes are corrected by comparing the calculated CRC remainder to a single bit error syndrome table and correcting the data, with the flag byte being corrected first. The data and flag byte are then forwarded to the second stage. In the second stage, the data and flag byte are corrected by comparing the calculated CRC remainder to a double bit error syndrome table. The flag byte is checked first by comparing the CRC remainder to syndrome table locations forty-three bits before the eight bits of the flag byte. The data and flag byte are then forwarded to the third stage. In the third stage, the second bit of the double bit error is corrected based on its position relative to the first bit of the double bit error (i.e. 43 bits apart) if the second error is in the same superblock. The error corrected data and flag byte are then forwarded from the third stage to control word realignment logic. According to the invention, processing is done in eight byte chunks at each stage iteratively until all bytes are processed, after which they are forwarded to the next stage. This allows a much narrower datapath which facilitates chip design and reduces latency because the logic circuits are simpler. According to the presently preferred embodiment, when an uncorrected error is detected, 10B error characters are output only for the last eight bytes of the superblock rather than all of the superblock as recommended in G.7041. This saves storage (56 bytes) and reduces delay in processing because bytes from the payload may continue to move through the process before the entire payload has been checked.

Additional objects and advantages of the invention will become apparent to those skilled in the art upon reference to the detailed description taken in conjunction with the provided figures.

BRIEF DESCRIPTION OF THE DRAWINGS

FIG. 7 is a high level flow chart illustrating correction of the second bit error of a double bit error according to the invention;

FIG. 8 is a single bit error syndrome table; and

FIG. 9 is a double bit error syndrome table.

DETAILED DESCRIPTION OF THE PREFERRED EMBODIMENTS

Figure 1:
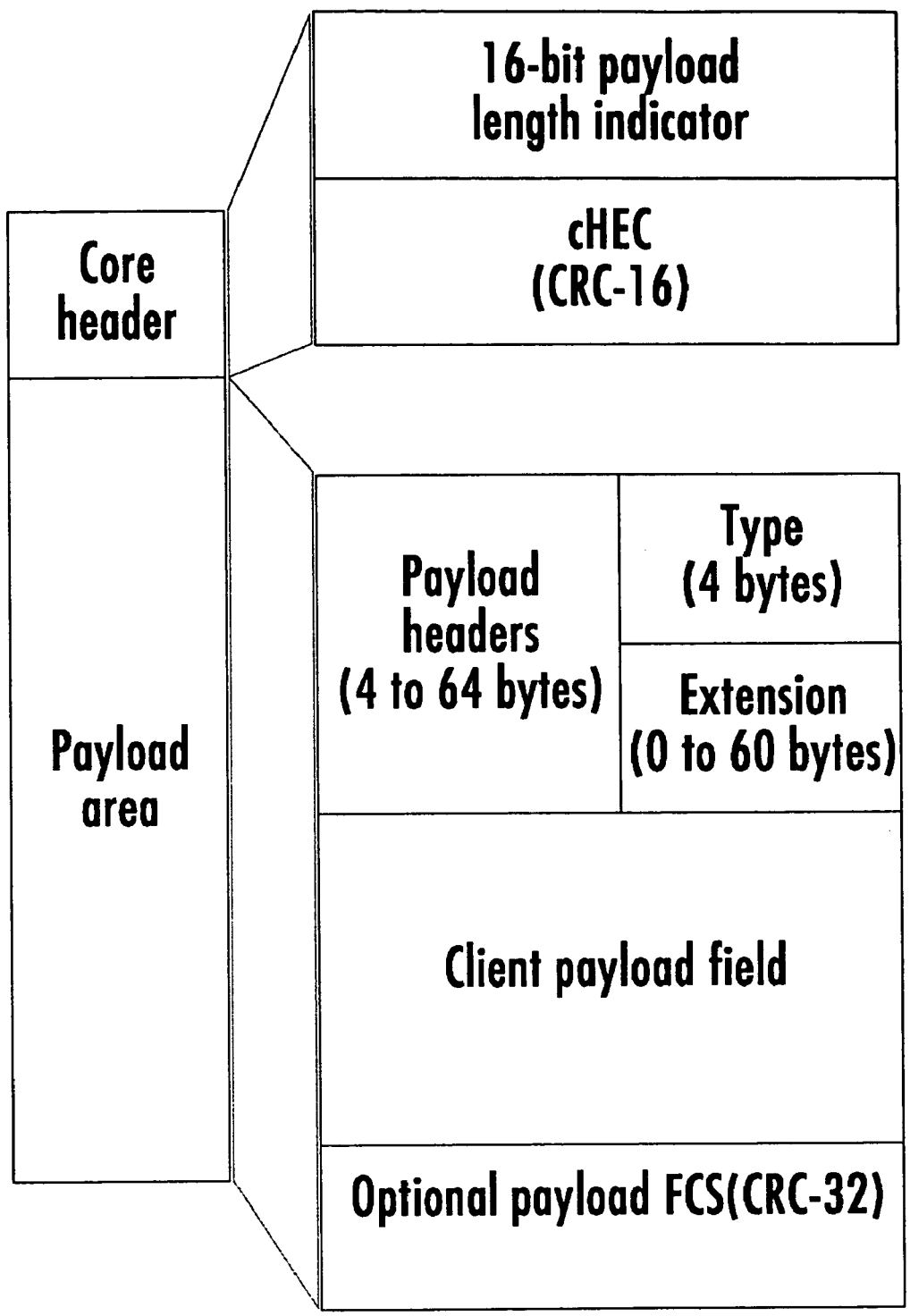
FIG. 1 is a prior art diagram of a GFP frame.
Figure 2:
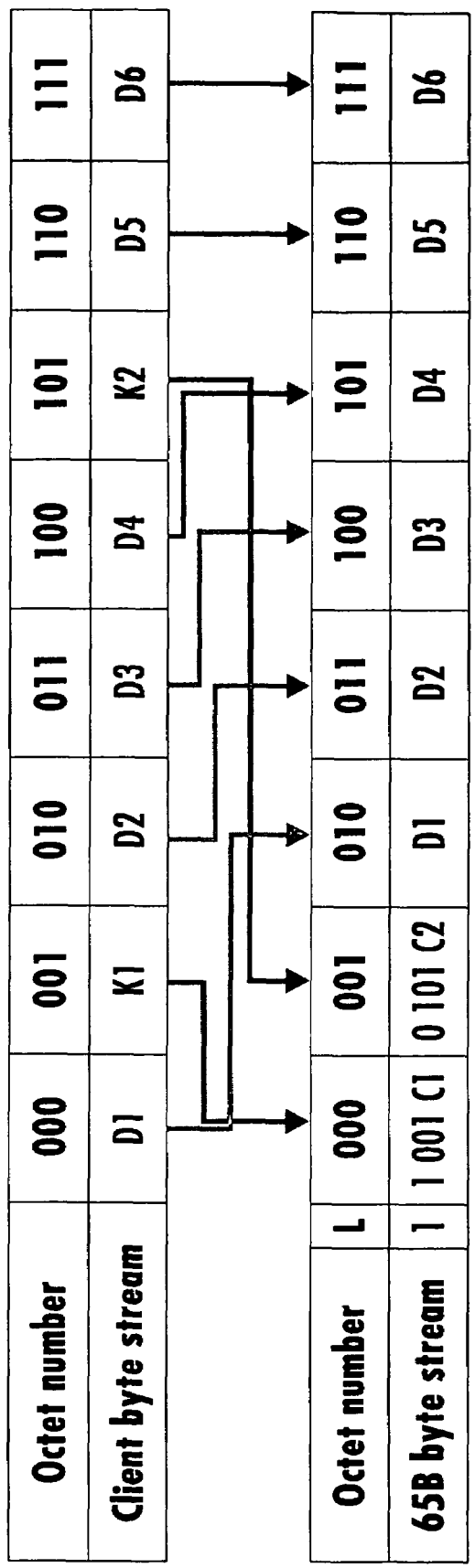
FIG. 2 is a prior art diagram illustrating the mapping of 8B/10B codes into a 64B/65B code.
Figure 3:
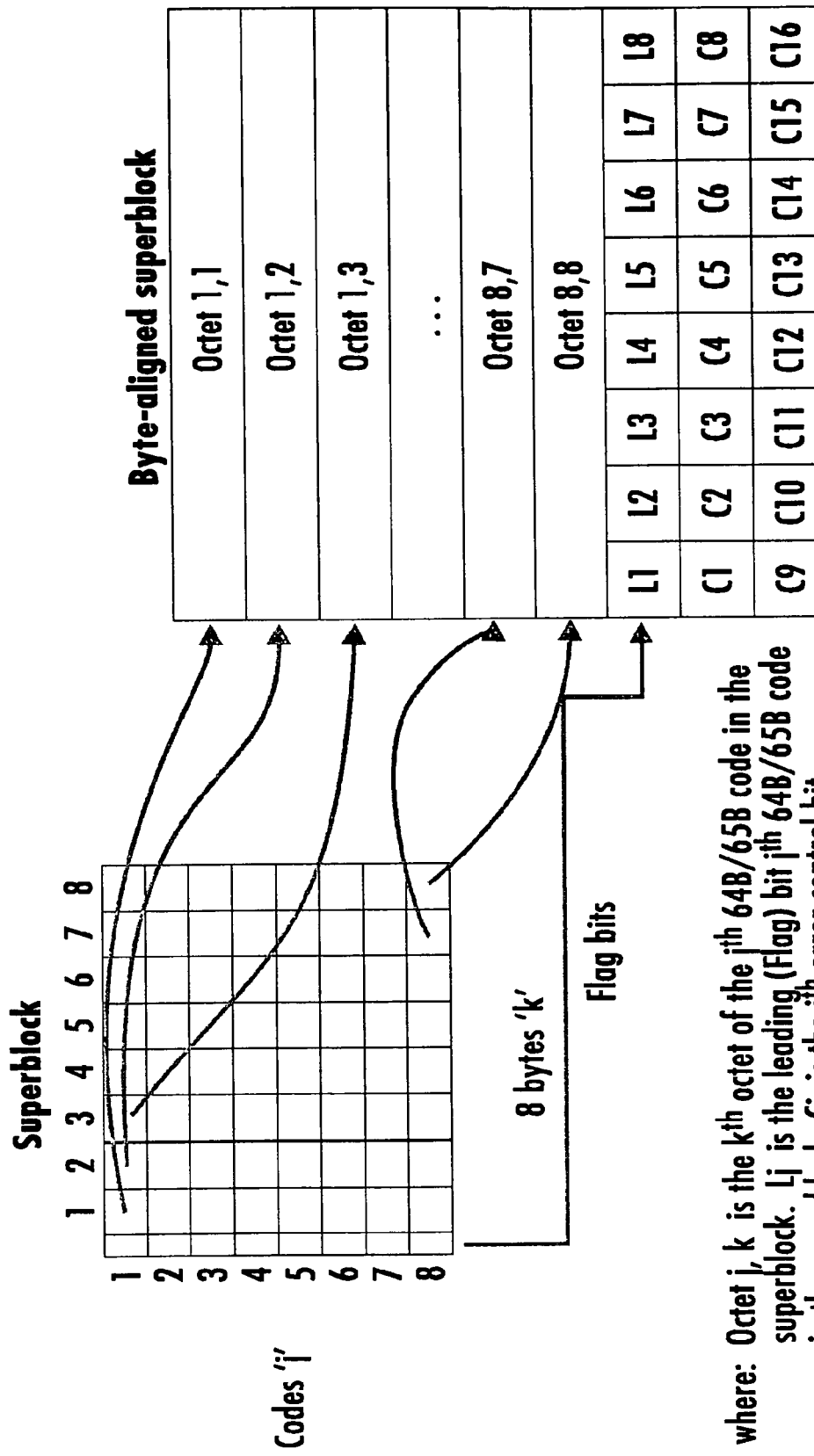
FIG. 3 is a prior art diagram illustrating the mapping of 64B/65B codes into a GFP-T superblock.
Figure 4:
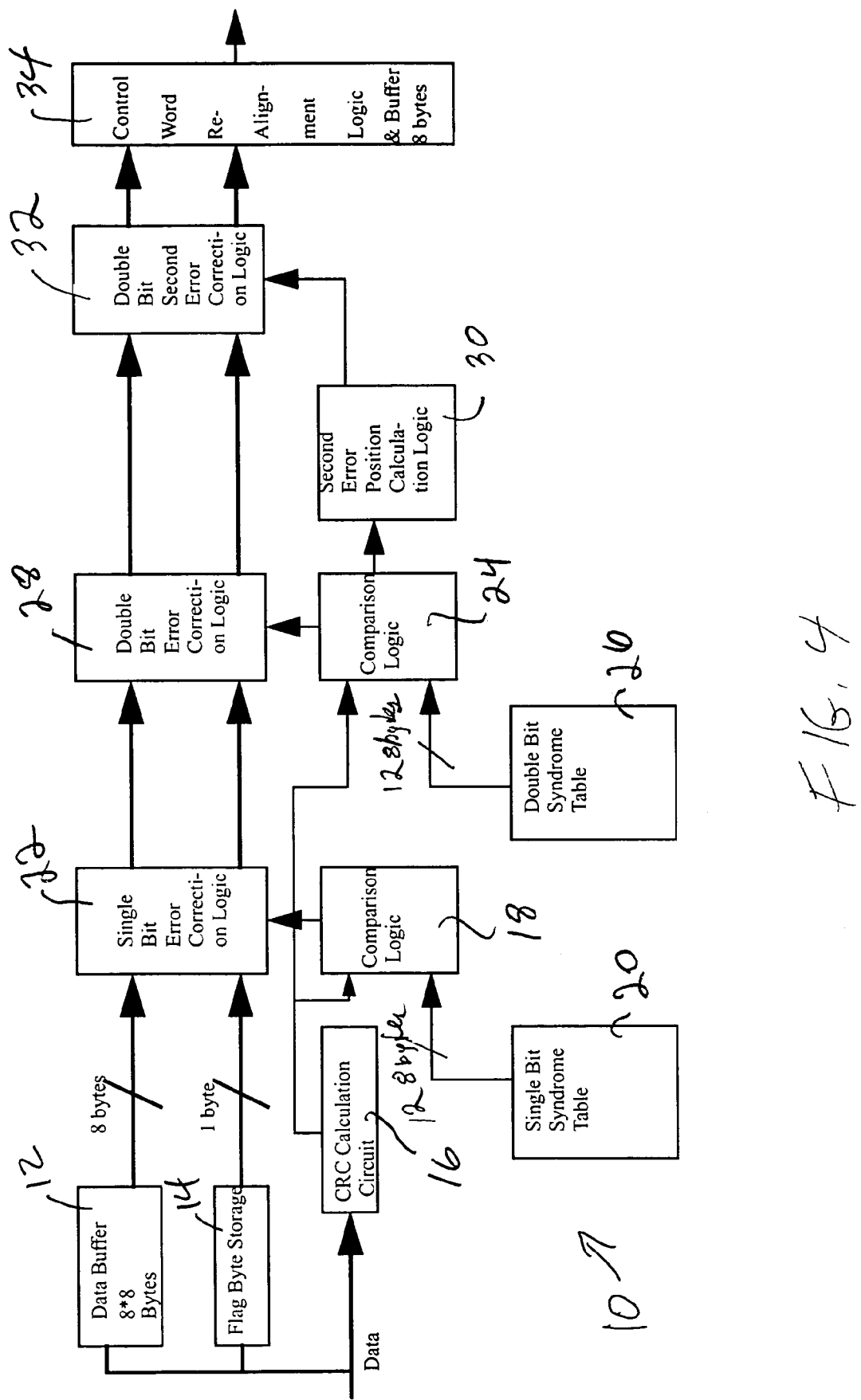
FIG. 4 is a high level schematic diagram illustrating an apparatus for performing the methods of the invention.

Turning now to FIG. 4, an apparatus 10 which is suitable for implementing the methods of the invention is shown in a high level block diagram. The incoming superblock is stored in two buffers 12 and 14. The buffer 12 stores the 64 bytes of data and the buffer 14 stores the flag byte. The incoming superblock is also passed through a CRC calculation circuit 16 which outputs the calculated CRC remainder for the superblock to a first comparison logic 18. The first comparison logic 18 compares the calculated CRC remainder to entries in a single bit error syndrome table 20 (described in more detail below with reference to FIGS. 5 and 8) and outputs a bit error location to single bit error correction logic 22 which also receives data and the flag byte from the buffer 12 and the storage 14. The correction logic 22 corrects single bit errors by inverting the bit at the bit error location indicated by the comparison logic 18.

The calculated CRC remainder from the circuit 16 is also provided to a second comparison logic 24 which compares it to entries in a double bit error syndrome table 26 (described in more detail below with reference to FIGS. 6, 7 and 9) and outputs a bit error location to a first double bit error correction logic 28 which also receives data and the flag byte from the single bit error correction logic 22. The correction logic 28 corrects the first bit error of double bit errors (or the second bit error if it is in the flag byte) by inverting the bit at the bit error location indicated by the comparison logic 24.

The output of the comparison logic 24 is also provided to second error position calculation logic 30 which adds forty-three to the bit error location and forwards it to a second double bit error correction logic 32. The logic 32 also receives data and the flag byte from the first double bit error correction logic 28. The correction logic 32 corrects the second bit error of double bit errors by inverting the bit at the bit error location indicated by the logic 30. After error correction, the data bytes and the flag byte are forwarded to control word realignment logic and buffer 34 which realigns the flag bits in front of the data bytes, then forwards the realigned superblock for further processing.

According to the presently preferred embodiment, the data bytes are processed eight bytes at a time. For example, one hundred twenty-eight bytes are read from the syndrome table (two bytes for every bit location in eight bytes of data). See FIGS. 8 and 9 where each line of the table refers to one byte, each entry corresponding to one bit. If the CRC remainder matches an entry in the syndrome table as found by the comparison logic 18, the corresponding bit in the eight bytes of data is inverted by the correction logic 22. The data is then shifted to the next stage (28) in the process and the next 128-bytes of the syndrome table is examined by the comparison logic 18 in conjunction with the next eight bytes of data from the buffer 12. The process proceeds in a pipeline fashion so that while the logic 18 and 22 are processing the second eight bytes, the logic 24 and 28 are processing the first eight bytes. According to the presently preferred embodiment, the flag byte is processed first so that it is always the first to arrive at the control word realignment logic 34. When the last byte of the superblock data leaves the buffer 12 a new flag byte replaces the contents of the storage 14 and the buffer 12 contains eight bytes of data from the next superblock. The process is scalable up to an STS-192 signal without timing difficulty.

Figure 5:
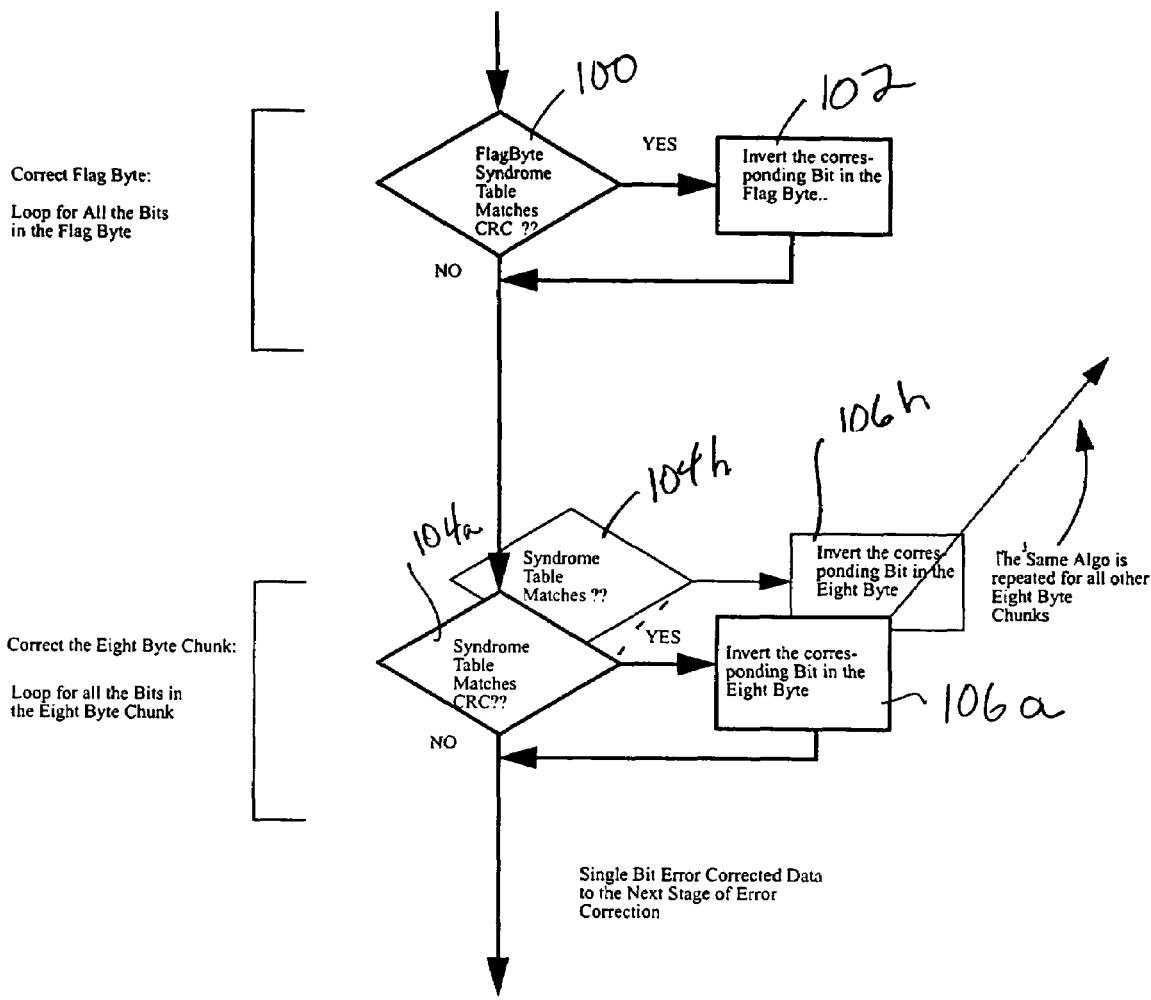
FIG. 5 is a high level flow chart illustrating single bit error correction methods according to the invention.

Referring now to FIG. 5, the operation of the single bit error correction logic is illustrated in a simplified schematic flow chart. First, at 100, the calculated CRC remainder is compared to the last row of the single bit error syndrome table (eight 16-bit entries) of FIG. 8. If the CRC remainder is equal to any of the eight entries in the row, an error in the flag byte is indicated and the corresponding bit in the flag byte is inverted at 102. In other words, if the remainder is equal to the first entry in the last row of the table, the first bit of the flag byte is inverted. If the remainder is equal to the second entry, the second bit of the flag byte is inverted, etc.

After the flag byte is processed for single bit error the calculated CRC remainder is compared at 104a to the first eight rows of the syndrome table of FIG. 8. These sixty-four entries correspond to the sixty-four bits of the first eight byte chunk of the sixty-four byte data payload. If a match is found, the corresponding bit is inverted at 106a. This process is repeated with the next eight rows of the table and the next eight bytes of data until all sixty-four bytes of data have been processed at 104h and corrected, if appropriate, at 106h.

Figure 6:
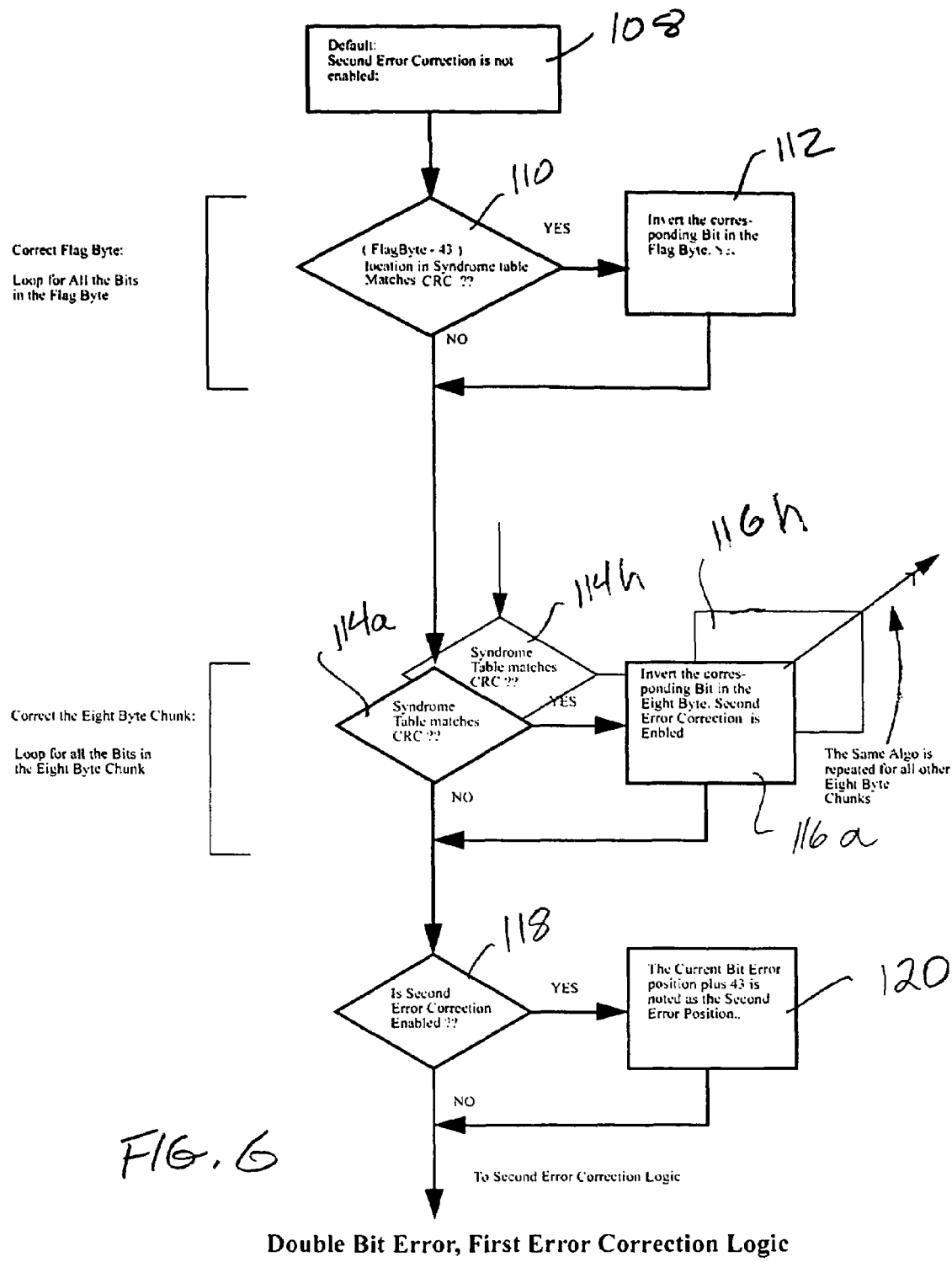
FIG. 6 is a high level flow chart illustrating correction of the first bit error of a double bit error according to the invention.

After the flag byte is processed for single bit error and while the calculated CRC remainder is compared to the first eight rows of the syndrome table of FIG. 8, the flag byte is passed to the next stage where it is processed for double bit errors as illustrated in FIG. 6.

If the first bit error of a double bit error exists in the flag byte, the second bit error will appear in the next superblock. In this case, the error will have been detected as a single bit error and will have been corrected in the first stage described with reference to FIG. 5. If the second bit error of a double bit error is in the flag byte, then both bit errors can be corrected. Similarly, if both bit errors occur in the sixty-four data bytes, both bit errors can be corrected.

Turning now to FIGS. 6 and 9, according to the presently preferred embodiment, a second error correction flag is set at 108 to "disabled" until a double bit error is detected. At 110, the calculated CRC remainder is compared to the eight entries in the table (FIG. 9) which precede the last eight entries by 43-bits. This attempts to find a second error of a double bit error in the flag byte. If a match is found at 110, the appropriate bit of the flag byte is corrected at 112. Second error correction remains disabled because the second error was actually corrected at 112. The data bytes are processed at 114a-h and if an error is found, it is corrected at one of 116a-116h. In the case where an error had been corrected in the flag byte, there is no need to enable second error correction. If second error correction is enabled as determined at 118, and an error was corrected at 116a-116h, the position of the bit error is incremented by forty-three to thereby determine the location of the second of the double bit error. This location is forwarded to the second double bit error correction logic which functions as illustrated in FIG. 7.

Correction of the second bit error of a double bit error is illustrated in FIG. 7. If second error correction is enabled and the second bit location is known as determined at 122, the second bit error is corrected at 124.

There have been described and illustrated herein methods and apparatus for error correction of transparent GFP superblocks. While particular embodiments of the invention have been described, it is not intended that the invention be limited thereto, as it is intended that the invention be as broad in scope as the art will allow and that the specification be read likewise. It will therefore be appreciated by those skilled in the art that yet other modifications could be made to the provided invention without deviating from its spirit and scope as claimed.

What is claimed is:

1. A method for correcting errors in a GFP-T (generic framing procedure-transparent mode) superblock having 64 bytes of data, a flag byte, and a 16 bit CRC, comprising:
   receiving the GFP-T superblock:
   buffering the 64 bytes of data in one buffer;
   buffering the flag byte in a separate buffer;
   calculating the CRC remainder;
   comparing the CRC remainder to a single bit error syndrome table;
   correcting a single bit error if the CRC remainder matches an entry in the single bit error syndrome table;
   comparing the CRC remainder to a double bit error syndrome table;
   correcting a double bit error if the CRC remainder matches an entry in the double bit error syndrome table; and
   outputting a corrected 64 bytes of data, wherein
   the flag byte is processed first and the data bytes are processed eight bytes at a time.

2. The method according to claim 1, wherein:
   the method is performed in three stages,
   in the first stage the flag byte and the data are subjected to single bit error correction,
   in the second stage the flag byte is subjected to second error double bit error correction and the data is subjected to first error double bit error correction, and
   in the third stage the data is subjected to second error double bit error correction.

3. An apparatus for correcting errors in a GFP-T (generic framing procedure-transparent mode) superblock having 64 bytes of data, a flag byte, and a 16 bit CRC, comprising:
   a data buffer for buffering the 64 bytes of data;
   a flag byte buffer for buffering the flag byte;
   a CRC calculation circuit for calculating the CRC remainder;
   a single bit error syndrome table;
   first comparison logic coupled to said CRC calculation circuit and to said single bit error syndrome table;
   single bit error correction logic coupled to said data buffer, said flag byte buffer, and to said first comparison logic;
   a double bit error syndrome table;
   second comparison logic coupled to said CRC calculation circuit and to said double bit error syndrome table;
   double bit error correction logic coupled to said single bit error correction logic and to said second comparison logic, wherein
   the flag byte is processed first and the data bytes are processed eight bytes at a time.

4. The apparatus according to claim 3, wherein:
   said double bit error correction logic includes
   first error correction logic coupled to said single bit error correction logic and to said
   second comparison logic, and
   second error correction logic coupled to said first error correction logic and to said
   second comparison logic, and wherein
   the flag byte and the data are subjected to single bit error correction by said single bit error correction logic,
   the flag byte is subjected to second error double bit error correction by said first error correction logic,
   the data is subjected to first error double bit error correction by said first error correction logic, and
   the data is subjected to second error double bit error correction by said second error correction logic.

5. The apparatus according to claim 4, wherein:
   said double bit error correction logic includes a second error position calculation logic coupled to said second comparison logic and said second error correction logic.

6. An apparatus for correcting errors in a GFP-T (generic framing procedure-transparent mode) superblock having 64 bytes of data, a flag byte, and a 16 bit CRC, comprising:
   a data buffer means for buffering the 64 bytes of data;
   a flag byte buffer means for buffering the flag byte;
   a CRC calculation circuit means for calculating the CRC remainder;
   a single bit error syndrome table means for indicating the location of a single bit error;
   first comparison logic means coupled to said CRC calculation circuit means and to said single bit error syndrome table means, said first comparison logic means for determining whether the CRC remainder matches an entry in said single bit error syndrome table means;
   single bit error correction logic means coupled to said data buffer means, said flag byte buffer means, and to said first comparison logic means, said single bit error correction logic means for correcting a single bit error indicated by said first comparison logic means;
   a double bit error syndrome table means for indicating the location of a first error of a double bit error;
   second comparison logic means coupled to said CRC calculation circuit means and to said double bit error syndrome table means, said second comparison logic means for determining whether the CRC remainder matches an entry in said double bit error syndrome table means;
   double bit error correction logic means coupled to said single bit error correction logic means and to said second comparison logic means, said double bit error correction logic means for correcting a double bit error indicated by said second comparison logic means, wherein
   the flag byte is processed first and the data bytes are processed eight bytes at a time.

7. The apparatus according to claim 6, wherein:
   said double bit error correction logic means includes
   first error correction logic means coupled to said single bit error correction logic means and to said second comparison logic means, said first error correction logic means for correcting one error of a double bit error, and
   second error correction logic means coupled to said first error correction logic means and to said second comparison logic means, and wherein
   the flag byte and the data are subjected to single bit error correction by said single bit error correction logic means,
   the flag byte is subjected to second error double bit error correction by said first error correction logic means,
   the data is subjected to first error double bit error correction by said first error correction logic means, and
   the data is subjected to second error double bit error correction by said second error correction logic means.

8. The apparatus according to claim 7, wherein:
   said double bit error correction logic means includes a second error position calculation logic means coupled to said second comparison logic means and said second error correction logic means, said second error position logic means for determining the location of a second error double bit error.

* * * * *